US00RE38760E

(19) United States
(12) Reissued Patent
Grant et al.

(10) Patent Number: US RE38,760 E
(45) Date of Reissued Patent: Jul. 19, 2005

(54) CONTROLLED ETCHING OF OXIDES VIA GAS PHASE REACTIONS

(75) Inventors: Robert W. Grant, Allentown, PA (US); Jerzy Ruzyllo, State College, PA (US); Kevin Torek, Boise, ID (US)

(73) Assignee: Penn State Research Foundation, University Park, PA (US)

(21) Appl. No.: 08/903,077

(22) Filed: Jul. 30, 1997

Related U.S. Patent Documents

Reissue of:
(64) Patent No.: 5,439,553
Issued: Aug. 8, 1995
Appl. No.: 08/219,961
Filed: Mar. 30, 1994

(51) Int. Cl.[7] ..... H01L 21/302; B08B 6/00; B44C 1/21

(52) U.S. Cl. ..... 438/723; 438/906; 438/908; 134/1.2; 134/1.3; 216/73; 216/79; 216/80

(58) Field of Search ..... 438/723, 906, 438/908; 156/645.1, 646.1, 642.1; 134/1.2, 1.3; 216/73, 79, 80

(56) References Cited

U.S. PATENT DOCUMENTS

| | | | |
|---|---|---|---|
| 3,194,703 | A | 7/1965 | Bloem |
| 3,272,748 | A | 9/1966 | Szkudlapski |
| 3,592,773 | A | 7/1971 | Müller |
| 3,598,741 | A | 8/1971 | Kanno |
| 3,677,848 | A | 7/1972 | Stoller et al. |
| 3,813,311 | A | 5/1974 | Beck et al. |
| 3,966,517 | A | 6/1976 | Claes et al. |
| 4,746,397 | A | 5/1988 | Maeda et al. |
| 4,749,440 | A | 6/1988 | Blackwood et al. |
| 4,857,142 | A | 8/1989 | Syverson |
| 4,871,416 | A | 10/1989 | Fukuda |
| 4,921,572 | A | 5/1990 | Roche |
| 5,022,961 | A | 6/1991 | Izumi et al. |
| 5,078,832 | A | 1/1992 | Tanaka |
| 5,112,437 | A | 5/1992 | Watanabe et al. |
| 5,228,206 | A | 7/1993 | Grant et al. |
| 5,234,540 | A | 8/1993 | Grant et al. |

OTHER PUBLICATIONS

Bersin, R.L., "The Dry Ox Process for Etching Silicon Dioxide", Solid State Technology, Apr. 1977, pp. 78–80.

Butterbaugh, J.W., Hiatt, C.F. and Gray, D.C.; "Gas–Phase Etching of Silicon Oxide with Anhydrous HF and Isopropanol", Third Int'l Symposium on Cleaning Technology in Semiconductor Development Mfg., Subcommittee of Electrochemical Society, Oct. 15–20, 1993.

Miki, N., Kikuyama, H., Maeno, M., Murota, J., and Ohmi, T.; "Selective Etching of Native Oxide By Dry Processing Using Ultra Clean Anhydrous Hydrogen Fluoride", 1988 IEEE, 730–733.

Jackman, R.B., Ebert, H. and Foord, J.S.; Reaction Mechanisms For The Photon–Enhanced Etching Of Semiconductors: An Investigation Of The UV–Stimulated Interaction of Chlorine With Si(100), Surface Science 176 (1986) 183–192.

Miki, N., Kikuyama, H., Kawanale, I. Miyashita M., and Ohmi T.; "Gas–Phase Selective Etching Of Native Oxide", IEEE 37:1 (1190) 107–115.

(Continued)

*Primary Examiner*—Ha Tran Nguyen
(74) *Attorney, Agent, or Firm*—Hugh D. Jaeger

(57) ABSTRACT

Oxides are etched with a halide-containing species and a low molecular weight organic molecule having a high vapor pressure at standard conditions, where etching is performed at preset wafer temperature in an enclosed chamber at a pressure such that all species present in the chamber, including water, are in the gas phase and condensation of species present on the etched surface is controlled. Thus all species involved remain in the gas phase even if trace water vapor appears in the process chamber. Preferably, etching is performed in a cluster dry tool apparatus.

1 Claim, 6 Drawing Sheets-

OTHER PUBLICATIONS

Philipossian, A.; "The Activity of $HF/H_2O$ Treated Silicon Surfaces in Ambient Air Before And After Gate Oxidation", J. Electrochem. Soc., vol. 139, No. 10, Oct. 1992, 2956–2961.

Ito, T., "Wafer Dry Cleaning With Photo–Excited Halogen Radicals", Proceedings—Institute of Environmental Sciences, pp. 808–813, 1991.

Ruzyllo, J., Torek, K., Daffron, C., Grant, R., and Novak, R.; "Etching of thermal Oxides in Low Pressure Anhydrous $HF/CH_3OH$ Gas Mixture at Elevated Temperature", J. Electrochem. Soc., vol. 140, No. 4, Apr. 1993.

Kao, D.B., Cairns, B.R., and Deal, B.E., "Vapor–Phase pre–Cleans for Furnace–Grown and Rapid–Thermal Thin Oxides." in: Ruzyllo, J., Novak, R.E., *Proceedings of the Second International Symposium on Cleaning Technology in Semiconductor Device Manufactoring*, the Electrochemical Society Softbound Proceedings Series (Pennington, NJ 1992), pp. 251–259.

Izumi, A., Matsuka, T., Takeuchi, T. and Yamano, A., "A New Cleaning Method By Using Anhyrous $HF/CH_3OH$ Vapor System." in: Ruzyllo, J., Novak, R.E., *Proceedings of the Second International Symposium on Cleaning Technology in Semiconductro Device Manufacturing*, the Electrochemical Society Softbound Proceedings Series (Pennington, NJ 1992), pp. 260–267.

Deal, B.E. and Helms, R., "Vapor Phase Wafer Cleaning Technology", Handbook of Semiconductor Wafer Cleaning Technology, pp. 274–297.

Ruzyllo, J., "Overview of Dry Wafer Cleaning Processes", Chapter 5 in: *Handbook of Silicon Wafer Cleaning Technology*, pp. 274–297, Noyes Publications, 1993.

Abstract, Toke, 1987 Derwent Publications Ltd.

Ruzyllo, J., "Dry Cleaning Processes", Intensive Course on Feb. 23–24, 1993 in Austin, Texas.

Donovan, R., et al., "Semiconductor Wafer Cleaning Technology", Intensive Course, Feb. 23–24, 1993.

CONTROLLED ETCHING OF OXIDES VIA GAS PHASE REACTIONS

Matter enclosed in heavy brackets [ ] appears in the original patent but forms no part of this reissue specification; matter printed in italics indicates the additions made by reissue.

BACKGROUND OF THE INVENTION

The present invention relates to a method of etching oxides on a substrate to minimize or prevent deposition of contamination on the substrate. In particular, the present invention relates to the etching of silicon oxides.

In integrated circuit manufacturing, the etching of oxides is typically carried out using a halide-containing water solution, for instance a HF/water solution, or reactive ion etching (RIE). The former method is not compatible with integrated processing of integrated circuits while the latter damages the surface of the substrate and contaminates the near-surface region of the substrate. As a result, neither method permits integration of oxide etching with other steps performed in a cluster processor.

The use of gaseous HF and water vapor, for example, is an alternative to RIE for gas-phase oxide etching. In this process, water vapor is needed to uniformly initiate etching. Gas phase etching can produce the same level of hydrogen termination as the traditional HF/water rinse process. The process is well developed and is supported by commercial reactors. It works on the premise that the HF-water vapor mixture delivered to the oxide condenses there, and hence, the etching process is eventually taking place in the liquid phase. One of the problems encountered with this etching mode is that some of the reaction products may precipitate on the surface where they are difficult to remove without an additional deionize water rinse. Also, difficulties with precise control of the condensed liquid film composition and its uniform coverage of the oxide may, under certain conditions, result in inadequate etch uniformity and run-to-run reproducibility. Moreover, since existing HF vapor etch chemistry generally involves the addition of water vapor, the process is difficult to integrate with reduced pressure reactors and stainless steel components.

U.S. Pat. No. 5,022,961 to Izumi et al., incorporated herein by reference, implements an approach in which etching is performed using HF and alcohol where water added to the system is minimized. Etching is performed at room temperature and atmospheric pressure and liquid as well as vapor state etching are contemplated. Ionic contaminant, however, remains on the surface after etching, contained within the alcohol layer. After-treatment is again required to remove the contamination.

Prior art etching techniques suggest that use of particular solvent molecules for etching in certain circumstances. Izumi et al., for instance, discusses etching with HF or other halide-containing species only in combination with alcohol. Wet etching has prevalently been disclosed with HF, water and acetic acid alone or a mixture of organic acids. U.S. Pat. No. 4,746,397 to Maeda et al. does disclose etching with the use of a fluorine-containing species and an alcohol ketone or carboxylic acid. However, liquid or vapor phase etching is contemplated under reduced pressure where the addition of water is specified.

It is disclosed in U.S. Pat. No. 4,857,142 to Syverson and U.S. Pat. No. 4,749,440 to Blackwood that etching may be accomplished with a minimum of added water where the oxide itself contains sufficient water. It is thus considered in the art that at least some water is required for etching.

Drawbacks of prior practice are addressed by the present invention in a method of etching oxides on a surface of a substrate comprising etching at a preset wafer temperature with a gas phase mixture of a halide-containing species and a low molecular weight organic molecule having a high vapor pressure at standard conditions, in an enclosed chamber at a pressure such that all species present are substantially maintained in the gas phase and condensation of species present on the etched surface is controlled. Because trace water vapor may appear in the process chamber, water vapor is taken into account as a species present in the gas phase. Because water is less volatile than the constituent reactants, the temperature and pressure parameters are chosen from the area below the curve for water in the phase diagram. By maintaining temperature and pressure parameters within this range, all species present in the chamber, including water, are substantially maintained in the gas phase. Low molecular weight organic molecules having high vapor pressure at standard conditions encompass low molecular weight alcohols, organic acids, ketones or alkanes such as methanol, isopropanol, acetone, acetic acid and methane. Preferably, etching is performed in a cluster dry tool apparatus. The process achieves controlled, gas-phase etching of oxides with etch rates up to two orders of magnitude lower than typical rates obtained for vapor HF/water etching, without the addition of water vapor to the input gases.

The present invention also addresses drawbacks of prior practice by a method of etching oxides comprising etching with a halide-containing species and water where the pressure and temperature parameters are, as discussed above, selectively chosen from parameters below the curve representing water in the phase diagram.

It is an objective of the present invention to provide a method of etching oxides in which the oxide etch rate is controlled.

It is an objective of the present invention to provide a method of etching oxides in which condensation of species present on the etched surfaces is controlled.

It is a further objective of the present invention to provide a method which controls etch at a rate of up to two orders of magnitude lower than typical rates obtained for vapor HF/water etching.

SUMMARY OF THE INVENTION

The present invention provides a method of etching oxides on a surface of a substrate comprising etching at a preset wafer temperature with a gas phase mixture of a halide-containing species and a low molecular weight organic molecule having a high vapor pressure at standard conditions, in an enclosed chamber at a pressure such that all species present are substantially maintained in the gas phase and condensation of species present on the etched surfaces is controlled. Because trace water vapor may appear in the process chamber, water vapor is taken into account as a species present in the gas phase. Because water is less volatile than the constituent reactants, the temperature and pressure parameters are chosen from the area below the curve for water in the phase diagram. By maintaining temperature and pressure parameters within this range, all species present in the chamber, including water, are substantially maintained in the gas phase. Low molecular weight organic molecules having high vapor pressure at standard conditions encompass low molecular weight alcohols, organic acids, ketones or alkanes such as methanol, isopropanol, acetone, acetic acid and methane. Preferably, etching is performed in a cluster dry tool apparatus. The process achieves controlled, gas-phase etching of oxides with etch rates of up to two orders of magnitude lower than typical rates obtained for vapor HF/water etching, without the addition of water vapor to the input gases.

Alternatively, the present invention may be used with a halide-containing species and water, without the addition of a low molecule weight, high vapor pressure organic molecule where the pressure and temperature parameters are again selectively chosen from parameters below the curve representing water in the phase diagram as discussed above.

DETAILED DESCRIPTION OF THE INVENTION

Figure 1:
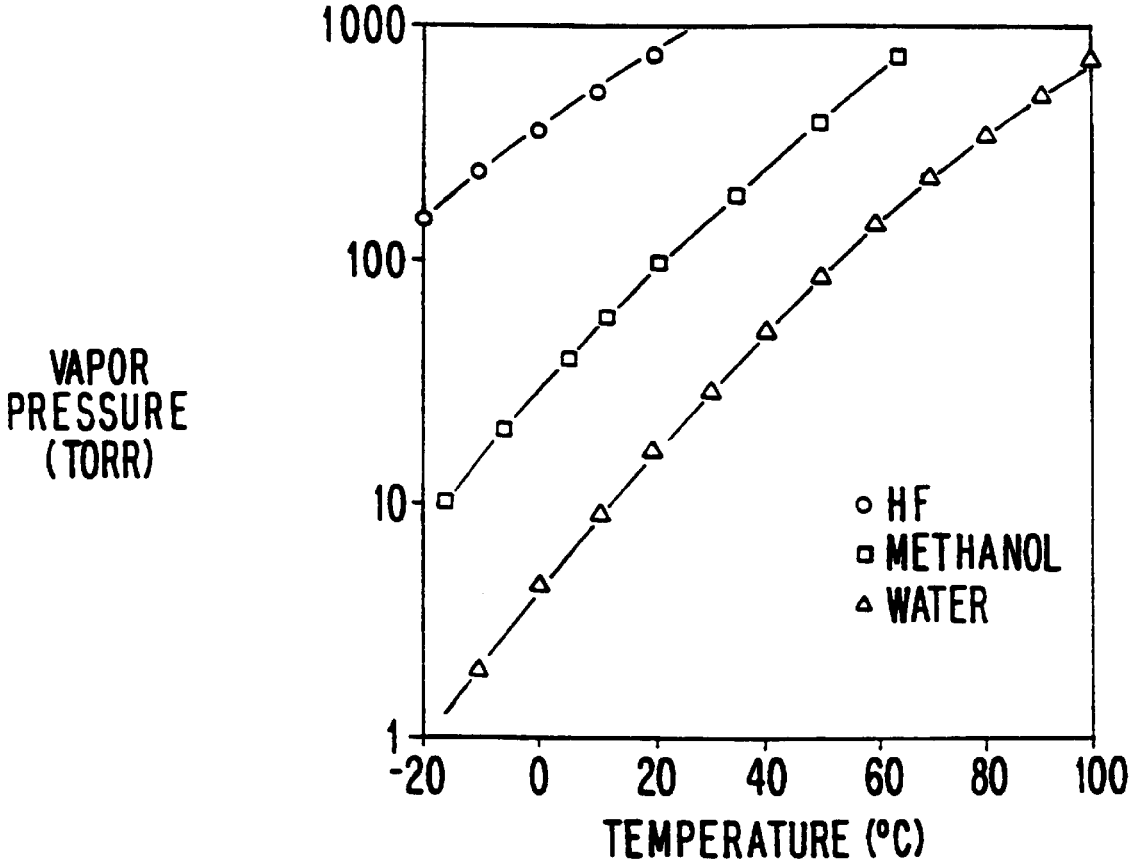
FIG. 1 is a phase diagram representing vapor pressure of HF, methanol and water as a function of temperature.

The gas-phase oxide etching method of the present invention involves the use of an agent effective in stimulating etching with gaseous HF as well as producing a hydrogen-transmitted surface. Furthermore, the present invention involves the creation of conditions under which the condensation of reactants and other contaminants on the oxide surface is either prevented, or more precisely controlled. The deposition of particulate contamination on the substrate surface, which would be nonvolatalizable if deposited, is thus prevented.

Etching is carried out at temperatures and pressures at which condensation of reactants on the wafer surface can be effectively controlled. To assure adequate process reproducibility and control of the etch, temperature and pressure parameters which prevent condensation of the reactants and water on the etched surface are selected. Under the process conditions preventing condensation and eliminating moisture from interacting with etched surfaces, BPSG: thermal oxide etch selectivity in excess of 6000 is observed. Also, there is indirect evidence suggesting hydrogen termination of etched silicon surfaces.

Preferably, etching is performed with a gas phase mixture of a halide-containing species and a low molecular weight organic molecule having a high vapor pressure at standard conditions. It is here recognized that organic molecules having low molecular weight and high vapor pressure at standard conditions are generally applicable in the method of the present invention. These molecules include low molecular weight alcohols, organic acids, ketones or alkanes such as methanol, isopropanol, acetone, acetic acid and methane. In addition to their favorable solvent properties, these molecules are volatalizable. It is most preferable that the low molecular weight, high vapor pressure organic molecules be capable of removing any water which may be present on the oxide surface, particularly, for instance, when etching a BPSG oxide. Furthermore, it is most preferable that the organic molecule be capable of ionizing the halide-containing species which etches the oxide and generating Si—OH precursor uniformly on the water surface. Such molecules which are most preferable include low molecular weight alcohols, organic acids and ketones such as methanol, isopropanol, acetone and acetic acid. Moreover, it has been recognized that such molecules actually initiate the etch when present with the halide-containing species. It is also believed that the presence of carbon in a low molecular weight, high vapor pressure molecule may be sufficient to stimulate the initiation of etching. Therefore, in a less preferred embodiment of the present invention, molecules which do not contain oxygen-bearing nucleophilic moieties yet are generally carbon containing organic molecules of low molecular weight and high vapor pressure at standard conditions, e.g., methane, may be utilized.

Halide-containing species include, in particular, HF, $NF_3$, $ClF_3$, $F_2$ as well as other fluoride liberating species. Generally, the halide-containing species are compounds that readily crack with UV treatment in the presence of a stimulant. Other examples of halide-containing species and low molecular weight, high vapor pressure organic molecules will be readily apparent to those skilled in the art.

The preferred aspect of the present invention focuses on the minimization of water present during the oxide etch. Therefore, it is preferred that either or both of the constituent reactant species be present in anhydrous form. Accordingly, in the preferred embodiment a low molecular weight organic molecule having a high vapor pressure at standard conditions is utilized with a halide-containing species, without the addition of water to the input gases. In the most preferred embodiment, anhydrous forms or both of these constituent reactant species are present, without the addition of water.

The selection of process parameters is made on the basis of a phase diagram showing the variation of vapor pressures vs. temperature. Water is considered as it is the least volatile among the species present including halide-containing species, low molecular weight organic molecules having high vapor pressure is standard conditions and any water present. FIG. 1 is a phase diagram representing individual vapor pressure curves of HF, methanol and water as a function of temperature. As long as the temperature and corresponding pressure of the oxide etching process are selected from the area below the curve for water as in FIG. 1, then all reactants involved should remain in the gas phase even if trace water vapor appears in the process chamber either as a product of the etching reaction, or in the input gases. In particular, where a surface of a substrate is at a preset temperature, etching is performed at a pressure such that all species present are substantially maintained in the gas phase and condensation of species present on the etched surface is controlled.

In this manner FIG. 1 indicates, for instance, that at 100 Torr, all species present during HF/methanol etching should be in the vapor phase at 60° C. and higher. At 300 Torr, all species present should be in the vapor phase at 80° C. and higher and at 500 Torr, the vapor phase should be achieved at 95° C. and higher. Generally, FIG. 1 illustrates that as a higher pressure is chosen, the minimum range of temperatures which may be chosen is correspondingly higher. As a higher temperature is chosen, the maximum range of pressure which may be chosen increases, in order to maintain all species present in the gas phase.

The same may not apply to the etching of heavily hydrated oxides, such as borophosphosilicate glass (BPSG), where moisture contained in the etched oxide may not be driven from the surface fast enough to prevent fast etching.

On the other hand, it is believed that increased temperature and reduced pressure will enhance vaporization of at least some reaction products, thereby reducing formation of solid residues on the etched surfaces.

In certain experiments, moisture has been driven from the oxide under vacuum conditions. Etching was then attempted with HF alone and with further addition of a low molecular weight organic molecule having a high vapor pressure at standard conditions. From these experiments it has been determined that in etching with a halide-containing species and a low molecular weight, high vapor pressure organic molecule, the low molecular weight, high vapor pressure organic molecule is responsible for initiation of the etch. Moreover, reactions of halide-containing species with water vapor and reactions of halide-containing species with low molecular weight, high vapor pressure organic molecules appear to be driven by different reaction mechanisms.

In a less preferred embodiment, the method of etching of the present invention is applicable to etching with a halide-containing species and water, without the use of a low molecular weight, high vapor pressure organic molecule. Similar to the method described above, temperature and pressure parameters are selectively chosen such that all constituents remain in the gas phase.

One application for which the method of the present invention is well suited is etching of sacrificial oxide in a cluster tool or like environment immediately prior to gate oxidation. The cluster tool apparatus has been disclosed in U.S. Pat. No. 5,228,206 to Grant et al., which is incorporated herein by reference. The cluster tool module permits dry process cleaning according to the present invention on a commercial scale. It includes a 200 mm. wafer compatible reactor equipped with IR heating lamps and a vacuum control system such as a dry mechanical pump and turbo pump allowing pressure reduction down to $10^{-6}$ Torr. To increase process uniformity, rotation of the wafer using a frictionless mechanism can be employed during etching. A high purity halide-containing species is delivered from a nickel cylinder, and a gas delivery system of stainless steel bubbler is used to contain and supply liquid low molecular weight organic solvent having high vapor pressure at standard conditions, with nitrogen as a carrier gas. This gas delivery system permits the gas to pick up the vapor without liquid transport. The system uses an all stainless steel gas delivery system. Moreover, the UV lamp assists in driving off molecules which may begin to condense, particularly after etching is complete and the species present are replaced with nitrogen gas. The use of the UV lamp markedly reduces processing time of the wafers.

The following examples demonstrate the applicability of HF/methanol and HF/acetone in the present invention. The present invention has also been observed to achieve similar results using ethanol as the low molecular weight, high vapor pressure organic molecule, as the results set forth in Examples I and II using methanol and acetone. A brief experiment using HF/acetic acid further indicated that acetic acid is also applicable in the present invention. It has also been documented that HF/isopropanol is applicable in the present invention and achieves analogous results to those shown for HF/methanol. See "Gas-Phase Etching of Silicon Oxide with Anhydrous HF and Isopropanol", Third Int'l Symposium on Cleaning Technology in Semiconductor Development Mfg., Subcommittee of Electro-chemical Society, Oct. 15–20, 1993, citing Ruzyllo et al., J. Electrochem. Soc., 140:4, April, 1993, p. L64–L66.

EXAMPLE I

A prototype cluster tool compatible commercial apparatus was used. Special attention was given to the elimination of moisture and the prevention of reactant condensation in any part of the hardware upstream of the pressure control valve. Variation of process parameters included changes of pressure from 100 to 500 Torr, wafer temperature from 25° to 110° C., and $CH_3OH$ carrier gas/HF gas flow ratio from 0 to 6. X-ray photoelectron spectroscopy (XPS) was used to evaluate the chemical condition of the silicon surface following etching.

Thermal oxides were grown in dry oxygen to the thickness of 1100 Å. For each etching run, initial and final oxide thicknesses were determined using an automated ellipsometer with index of refraction n=1.465. For the sake of preliminary evaluation of etch selectivity, the rates of BPSG etching under the conditions defined above were also determined. The BPSG films initially 6500 Å thick were formed using a conventional chemical vapor deposition process.

The experimental portion was focused on: (i) establishing a correlation between oxide etch rates and pressure of anhydrous $HF/CH_3OH/N_2$ mixture and wafer temperature, and (ii) determining the effect of methanol on the etch rates and chemical state of the Si surfaces.

Figure 2:
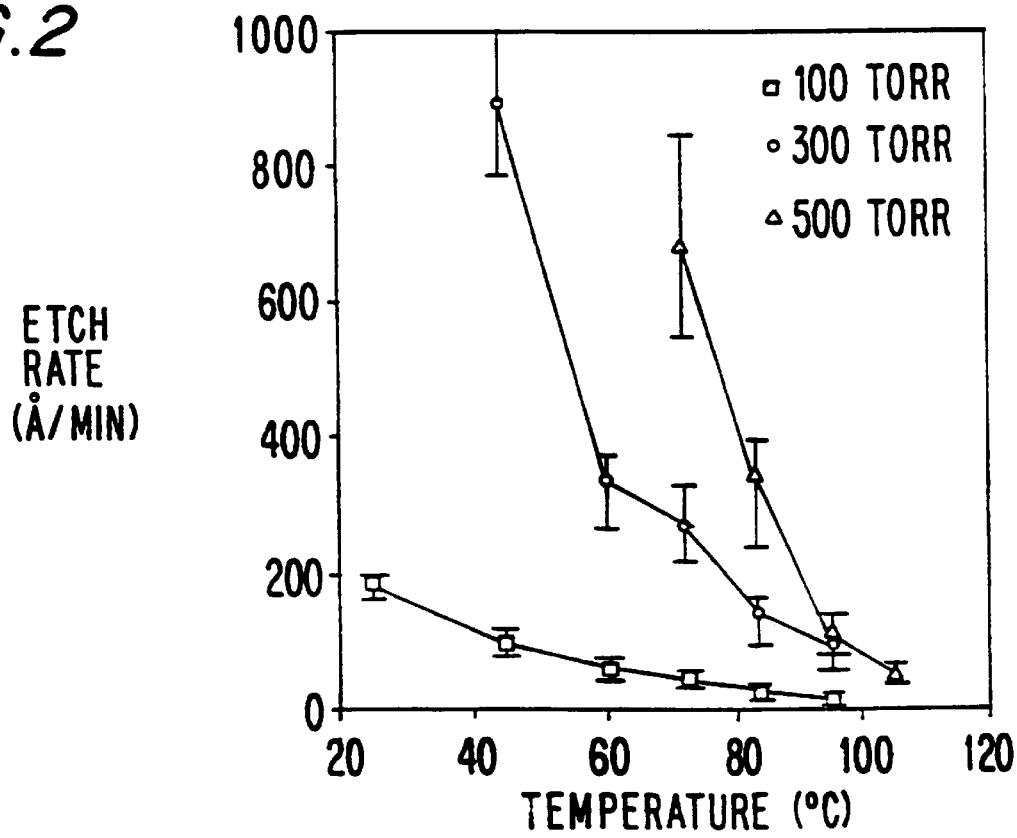
FIG. 2 is a graph of oxide etch rates in HF/methanol at three different pressures as a function of wafer temperature.

Etching was performed with HF and methanol at various pressures and wafer temperatures. An IR pyrometer was used to determine wafer temperature. FIG. 2 presents the observed changes of thermal oxide etch rates in HF/methanol at three different pressures as a function of wafer temperature. As seen in FIG. 2, etch rates decrease as wafer temperatures increase. Moreover, at higher pressures these changes are significantly more pronounced. In addition, the etch rates are much more reproducible at temperatures which, at any given pressure, correspond to the etching region assumed to be condensation-free. Thus the pressure and temperature parameters discussed above in regard to the phase diagram of FIG. 1 are shown to have the most controlled etch rate in FIG. 2. These effects are an indication that with increased wafer temperature, less condensation is gradually taking place and gas-phase reactions are becoming a dominant factor in the etching process. This behavior is reflected by the oxide etch rates up to two orders of magnitude lower than typical rates obtained for vapor HF/water etching. In the condensation-controlled etching regime identified in FIG. 2, variations of temperature and pressure can be used to control etch rates of oxides from zero to about 200 Å/min.

Etching with HF/methanol was thus accomplished at a selectively chosen pressures of between 100 to 500 Torr and corresponding wafer temperatures of between 25° to 120° C. such that all species present are in the gas phase and condensation of species present on the etched surfaces is controlled. In particular, gas phase etching with HF and methanol with a controlled etch was achieved at a preset temperature and at a pressure such that water is substantially maintained in the gas phase. As shown in FIG. 2, such parameters were demonstrated in the HF/methanol system at 100 Torr from 20° C. to 95° C.; and 300 Torr from 80° to 95° C.; and at 500 Torr from 95° to 105° C.

In the case of BPSG however, under the same process conditions the etch rates remain very high; typically etch rates in excess of 6000 Å/min were recorded which means that BPSG; thermal oxide etch selectivity in the range of thousands can be accomplished. These high etch rates are believed to be due to the heavy hydration of BPSG resulting in significant enhancement of the etching reaction. At the temperature and pressures applied in this experiment moisture contained in BPSG is not driven away fast enough to prevent fast oxide etching.

Figure 3:
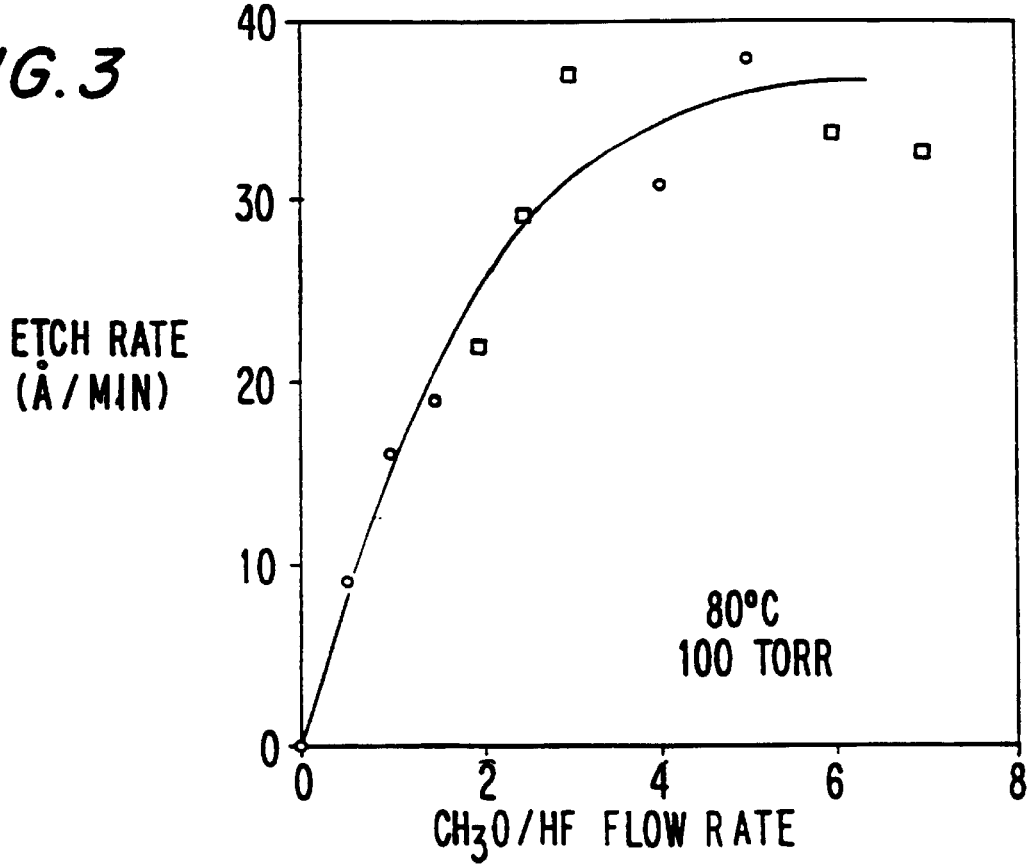
FIG. 3 is a graph of oxide etch rate as a function of HF/methanol flow ratio.

In order to test the effect of methanol on the oxide etching in the condensation-controlled regime, moisture was driven from the oxide under vacuum conditions and the etch rates for various $CH_3OH/HF$ ratios were determined. Surprisingly, the results shown in FIG. 3 clearly demonstrate that the methanol is responsible for initiating the etching process. An important data point shown is the apparent lack of any etching taking place at the $CH_3OH/HF=0$, i.e., during exposure of the oxide to gaseous HF only. This result indicates that methanol is the initiator of the etching reactions, and hence, that the controlled, effective etching of dry thermal oxide can be accomplished without the addition of water vapor to the input gases. The participation of moisture likely generated as a product of chemical reactions involved in etching does not change the fact that the mechanism of $HF/CH_3OH$ etching appears to be different from vapor $HF/H_2O$ etching. This notion is supported by the comparison between predicted $SiO_2$ etch rates for the $HF/H_2O$ process at 25° C. and 100 Torr with etch rates observed in this experiment at the same temperature and pressure. In this experiment etch rates are six to eight times lower than predicted rates for vapor $HF/H_2O$ etching, which indicates a different process etching mechanism for each.

The same $HF_2$— species are likely responsible for oxide etching in the case of both vapor HF/water and $HF/CH_3OH$ etching. Since the former is known to yield a mostly hydrogen-terminated silicon surface, one can expect the same in the case of $HF/CH_3OH$ etching. Two observations support this speculation. One is that silicon surfaces, from which the oxide was removed entirely using the $HF/CH_3OH$ chemistry, display hydrophobic features as revealed through visual inspection of the behavior of water droplets on the etched surfaces. The second comes from the x-ray photoelectron spectroscopy (XPS) characterization of $HF/CH_3OH$ treated surfaces.

Figure 4:
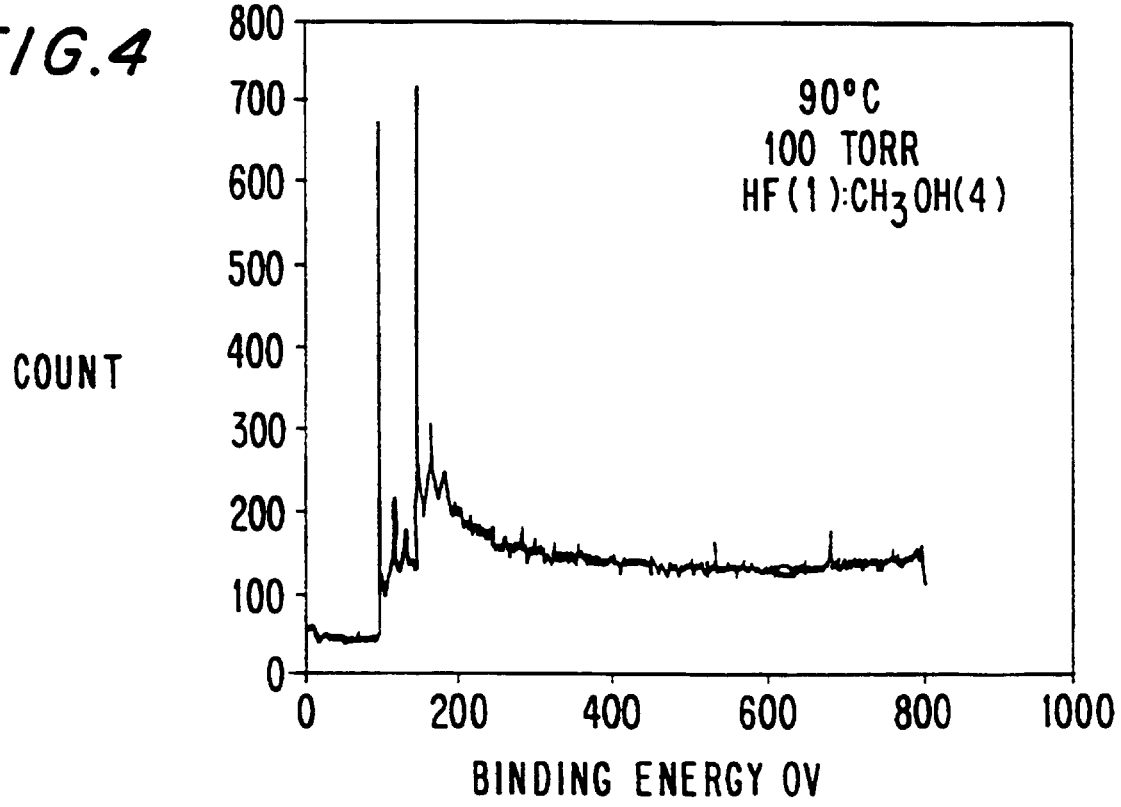
FIG. 4 is a graph of XPS spectra for HF/methanol treated substances in accordance with the present invention.

FIG. 4 is a graph of XPS spectra for HF/methanol treated substances in accordance with the present invention. As XPS cannot detect hydrogen, weak $F_{15}$ and $O_{15}$ peaks may be an indication of a mostly hydrogen-terminated surface. In fact, the XPS spectrum in this case is strikingly similar to the one reported for a vapor HF/water treated silicon surface.

EXAMPLE II

The above experiments were performed under the same operating conditions, although utilizing HF/acetone rather than HF/methanol.

Figure 5:
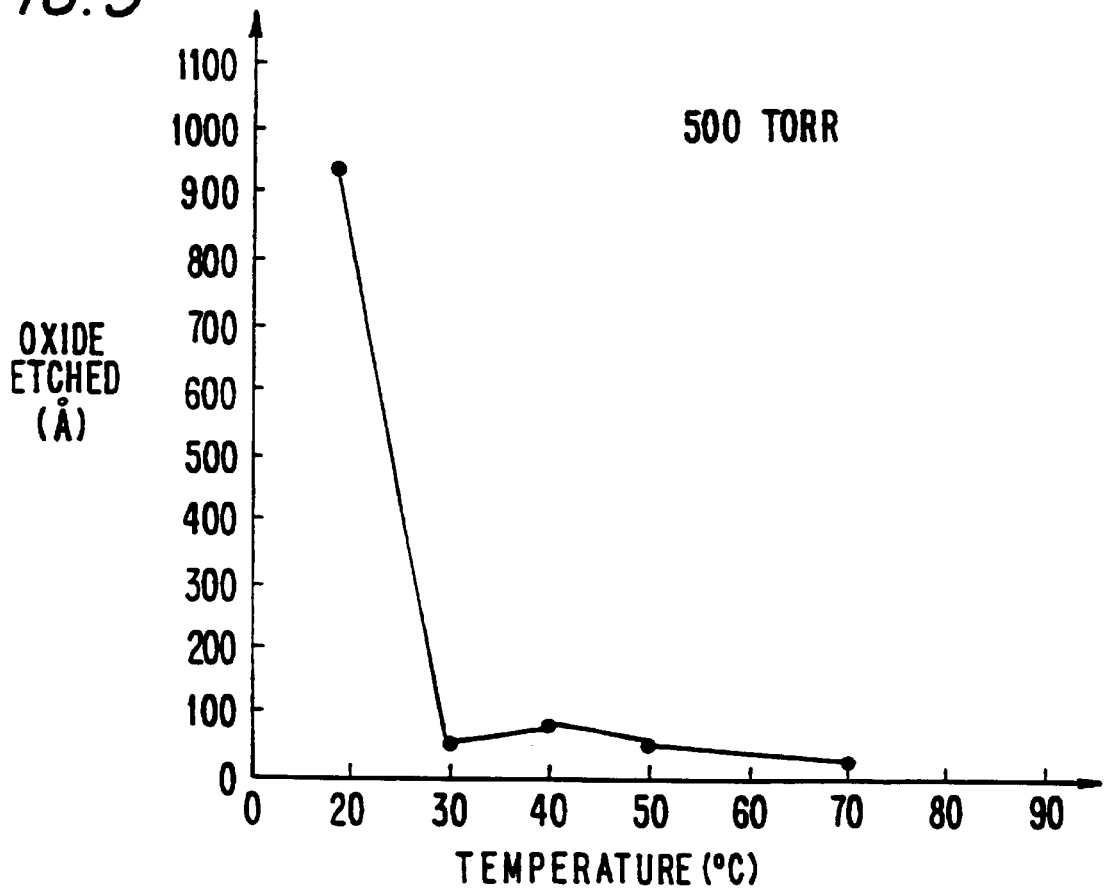
FIG. 5 is a graph of oxide etched in HF/acetone as a function of temperature.

FIG. 5 is a graph of oxide etched in HF/acetone as a function of temperature at a pressure of 500 Torr. Flow rates were as follows: acetone at 300 standard cubic centimeters per minute (sccm); nitrogen at 425 sccm; and HF at 100 sccm. While not depicting rate of etch v. temperature as in FIG. 2 regarding the use of HF/methanol, the results shown for HF/acetone are similar to those of HF/methanol. At 500 Torr a sharp increase in etch rate occurs with HF/acetone at lower temperatures, similar to that observed for HF/methanol. At higher temperatures, above 30° C., a slow, controlled etch rate is observed, similar to the rate observed at higher temperatures for HF/methanol.

As in Example I for HF/methanol, the gas phase oxide etching results with HF/acetone indicate that etching was achieved at a preset temperature and pressure such that all species present, including water, are substantially maintained in the gas phase and condensation of species present on the etched surfaces is controlled. Thus it appears from FIG. 5, that a controlled etch is obtained for HF/methanol at 500 Torr from about 30° C. to 70° C.

Figure 6:
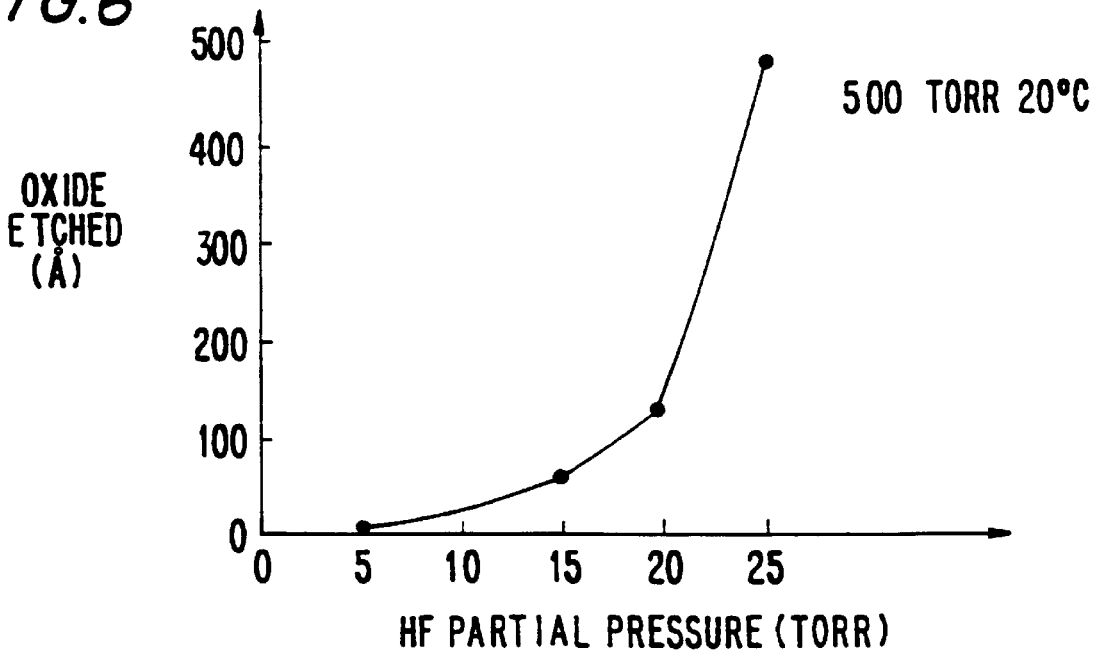
FIG. 6 is a graph of oxide etched in HG/acetone as a function of HF partial pressure.

FIG. 6 is a graph of oxide etched in HF/acetone as a function of HF partial pressure at 500 Torr and 20° C., with a total flow of 1000 sccm and an acetone flow of 364 sccm. The amount of oxide etched increases exponentially with HF partial pressure. These results are also similar to those shown in FIG. 3 for each rate v. HF/methanol flow ratio.

It will be understood that changes may be made in the above-described method without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

What is claimed is:

1. A method of etching oxides on a surface of a substrate, said substrate being at a temperature *from 30° C. to 70° C.,* said method comprising etching with a gas phase mixture of [a halide-containing species, an organic material having a higher vapor pressure than water at standard conditions of room temperature and pressure of 1 atmosphere and water, in an enclosed chamber at a pressure such that] *HF and acetone in an enclosed chamber at a pressure of 500 Torr such that a reaction product* water is substantially maintained in the gas phase and condensation of species present on the etched surface is minimized.

[2. A method of etching as claimed in claim 1 where the etching is performed in an enclosed chamber of a cluster dry tool apparatus.]

[3. A method of etching as claimed in claim 1 where the organic material having a higher vapor pressure than water at standard conditions of room temperature and pressure of 1 atmosphere is selected from the group consisting of alcohols, organic acids, ketones and alkanes.]

[4. A method of etching as claimed in claim 3 where the organic material having a higher vapor pressure than water at standard conditions of room temperature and pressure of 1 atmosphere in selected from the group consisting of methanol, isopropanol, acetone, acetic acid and methane.]

[5. A method of etching as claimed in claim 1 where the halide-containing species is selected from the group consisting of HF, $NF_3$, $ClF_3$ and $F_2$.]

[6. A method of etching as claimed in claim 1 where the halide-containing species is HF, the organic material having a higher vapor pressure than water at standard conditions of room temperature and pressure of 1 atmosphere is methanol, the pressure is 100 Torr and the preset temperature is from 20° C. to 95° C.]

[7. A method of etching as claimed in claim 1 where the halide-containing species is HF, the organic material having a higher vapor pressure than water at standard conditions of room temperature and pressure of 1 atmosphere is methanol, the pressure is 300 Torr and the temperature is from 80° C. to 95° C.]

[8. A method of etching as claimed in claim 1 where the halide-containing species is HF, the low molecular weight organic molecule having a higher vapor pressure than water at standard conditions of room temperature and pressure of 1 atmosphere is methanol, the pressure is 500 Torr and the preset temperature is from 95° C. to 105° C.]

[9. A method of etching as claimed in claim 1 where the etching is performed in an enclosed chamber which is a reactor body of an apparatus further comprising:

a gas delivery system;

a UV source;

an IR source;

a rotating mechanism to rotate the wafer; and a vacuum control system.]

[10. A method of etching as claimed in claim 1 where the organic material having a higher vapor pressure than water at standard conditions of room temperature and pressure of 1 atmosphere is anhydrous.]

[11. A method of etching as claimed in claim 1 where the halide-containing species is anhydrous.]

[12. A method of etching oxides on a surface of a substrate, said substrate being at a temperature of from 30° C. to 70° C., said method comprising etching with a gas phase mixture of HF and acetone, in an enclosed chamber at a pressure of 500 Torr such that water is substantially maintained in the gas phase and condensation of species present on the etched surface is minimized.]

* * * * *